United States Patent
Huang (10) Patent No.: US 9,214,552 B2
(45) Date of Patent: Dec. 15, 2015

(54) METHOD FOR FABRICATING A STRAIN FEATURE IN A GATE SPACER OF A SEMICONDUCTOR DEVICE

(71) Applicant: Taiwan Semiconductor Manufacturing Company, Ltd., Hsin-Chu (TW)

(72) Inventor: Yu-Lien Huang, Jhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/293,206

(22) Filed: Jun. 2, 2014

(65) Prior Publication Data
US 2014/0264442 A1    Sep. 18, 2014

Related U.S. Application Data

(63) Continuation of application No. 13/672,313, filed on Nov. 8, 2012, now Pat. No. 8,741,759.

(51) Int. Cl.
| | |
|---|---|
| *H01L 29/78* | (2006.01) |
| *H01L 29/08* | (2006.01) |
| *H01L 29/66* | (2006.01) |
| *H01L 29/51* | (2006.01) |

(52) U.S. Cl.
CPC ........ *H01L 29/7848* (2013.01); *H01L 29/0847* (2013.01); *H01L 29/6653* (2013.01); *H01L 29/66553* (2013.01); *H01L 29/66628* (2013.01); *H01L 29/66636* (2013.01); *H01L 29/517* (2013.01)

(58) Field of Classification Search
None
See application file for complete search history.

(56) References Cited

U.S. PATENT DOCUMENTS

| | | | |
|---|---|---|---|
| 7,989,298 B1 | 8/2011 | Chan et al. | |
| 8,614,132 B2 | 12/2013 | Tsai et al. | |
| 8,741,759 B2* | 6/2014 | Huang | 438/590 |
| 2006/0289856 A1* | 12/2006 | Shimamune et al. | 257/19 |
| 2009/0001430 A1 | 1/2009 | Chakravarti et al. | |
| 2013/0207166 A1 | 8/2013 | Chen et al. | |
| 2014/0048855 A1* | 2/2014 | Huang et al. | 257/288 |

* cited by examiner

*Primary Examiner* — Scott B Geyer
(74) *Attorney, Agent, or Firm* — Slater & Matsil, L.L.P.

(57) ABSTRACT

A method for fabricating a semiconductor device is disclosed. The method includes forming a gate stack over a substrate, forming spacers adjoining opposite sidewalls of the gate stack, forming a sacrificial layer adjoining the spacers, removing a portion of the sacrificial layer, removing a portion of the spacers to form a recess cavity below the left spacers. Then, a strain feature is formed in the recess cavity. The disclosed method provides an improved method by providing a space between the spacer and the substrate for forming the strained feature, therefor, to enhance carrier mobility and upgrade the device performance.

20 Claims, 10 Drawing Sheets

METHOD FOR FABRICATING A STRAIN FEATURE IN A GATE SPACER OF A SEMICONDUCTOR DEVICE

CLAIM TO PRIORITY

This application is a continuation of U.S. patent application Ser. No. 13/672,313, filed on Nov. 8, 2012, and entitled "Method for Fabricating a Semiconductor Device," which application is incorporated herein by reference.

FIELD

The disclosure relates to integrated circuit fabrication and, more particularly, to a semiconductor device with a strained structure.

BACKGROUND

When a semiconductor device, such as a metal-oxide-semiconductor field-effect transistor (MOSFET), is scaled down through various technology nodes, high-k gate dielectric layers and metal gate electrode layers are incorporated into the gate stack of the MOSFET to improve device performance with the decreased feature sizes. In addition, strained structures in source and drain (S/D) recess cavities of the MOSFET utilizing selectively grown silicon germanium (SiGe) may be used to enhance carrier mobility.

However, there are challenges to implement such features and processes in complementary metal-oxide-semiconductor (CMOS) fabrication. As the gate length and spacing between devices decrease, these problems are exacerbated. For example, it is difficult to achieve enhanced carrier mobility for a semiconductor device, because strained materials cannot deliver a given amount of strain into the channel region of the semiconductor device, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the relative dimensions of the various features may be arbitrarily increased or reduced for clarity of discussion.

DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
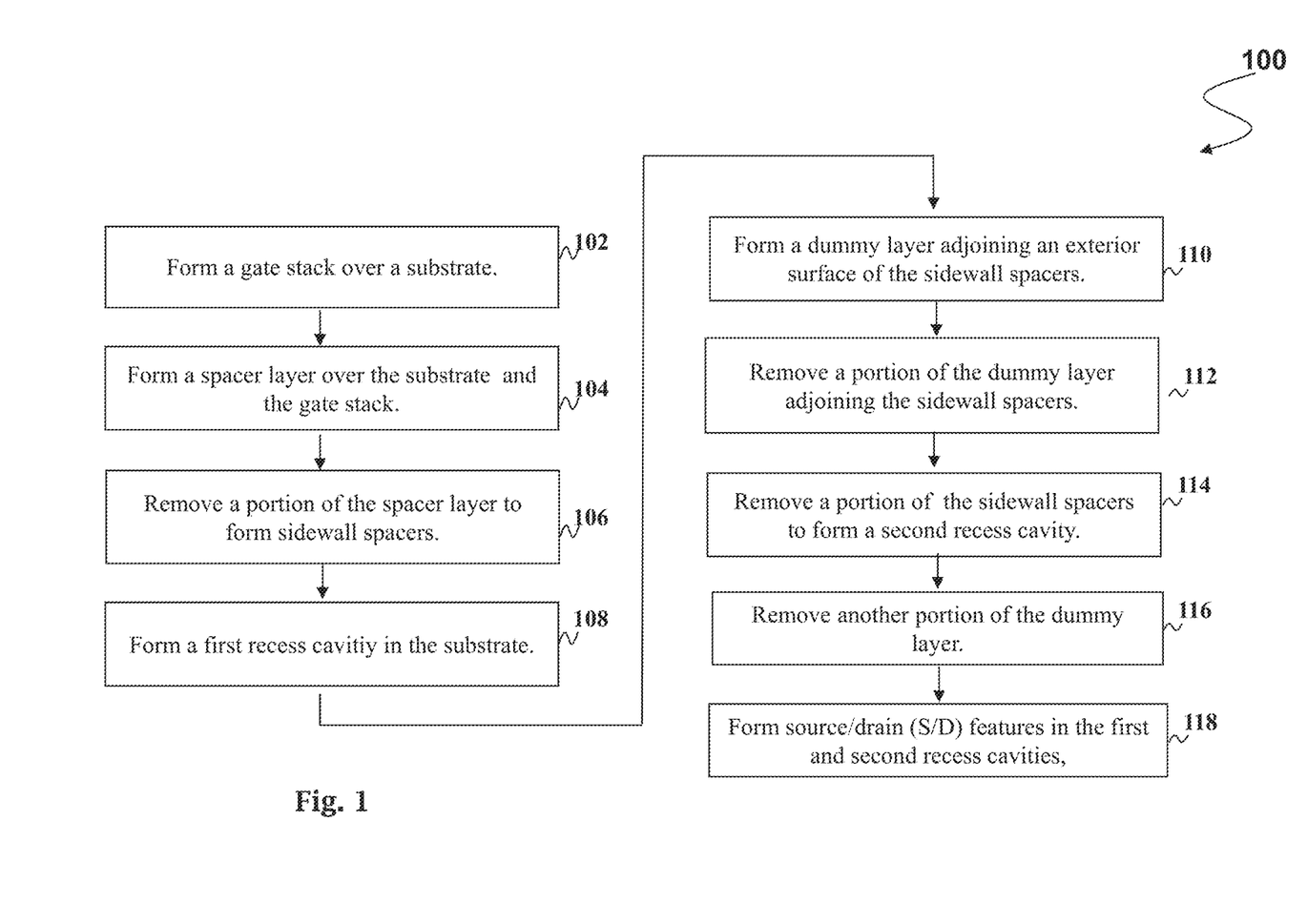
FIG. 1 is a flowchart illustrating a method for fabricating a semiconductor device comprising a strained structure according to various aspects of the present disclosure.

FIG. 1 is a flowchart illustrating a method 100 for fabricating a semiconductor device 200 according to various aspects of the present disclosure. FIGS. 2-10 show schematic cross-sectional views of a semiconductor device 200 at various stages of fabrication according to an embodiment of the method 100 of FIG. 1. The semiconductor device 200 may be included in a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 10 are simplified for a better understanding of the present disclosure. For example, although the figures illustrate the semiconductor device 200, it is understood the IC may comprise a number of other devices comprising resistors, capacitors, inductors, fuses, etc.

Figure 2:
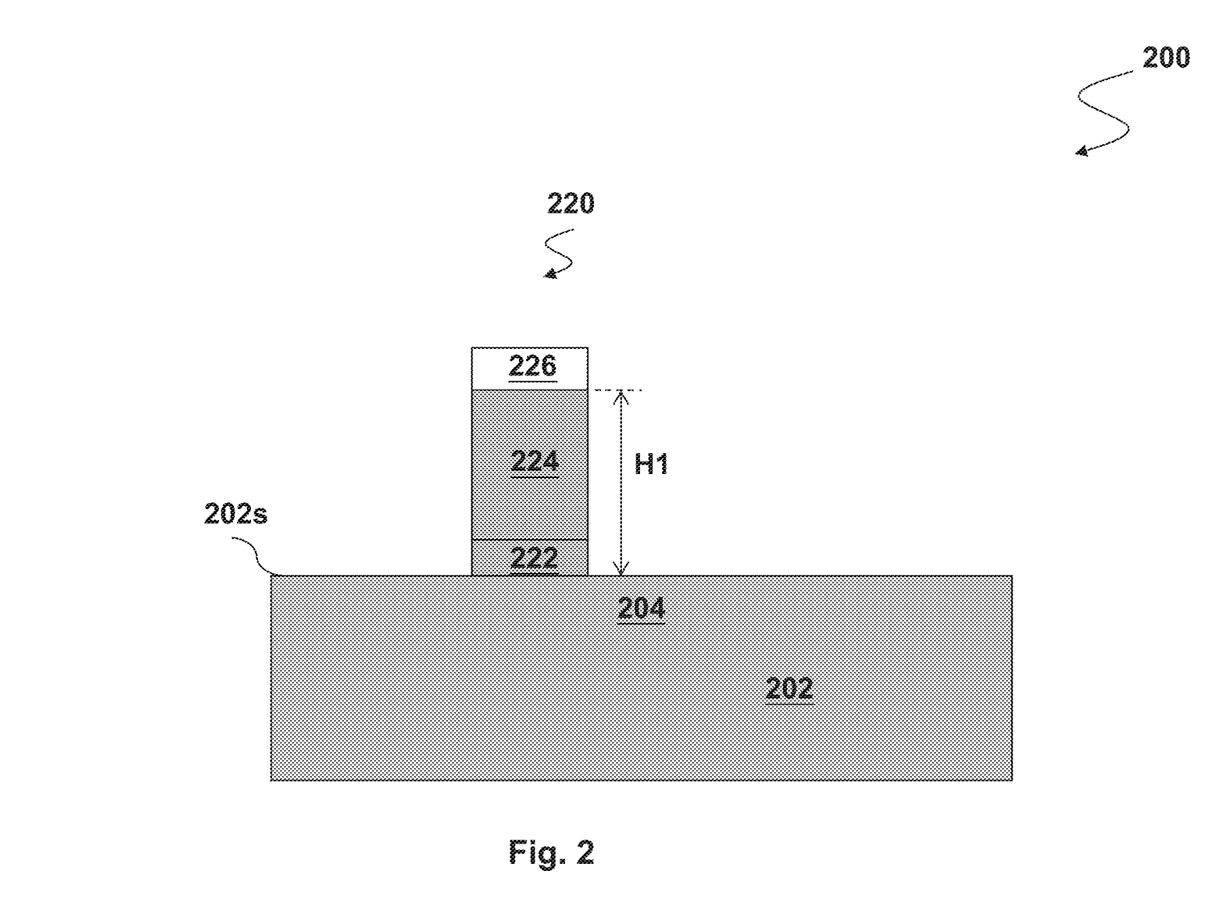
FIGS. 2-10 show schematic cross-sectional views of a strained structure of a semiconductor device at various stages of fabrication according to various aspects of the present disclosure.

Referring to FIGS. 1 and 2, the method 100 begins at step 102 wherein a gate stack 220 is formed over a substrate 202. The substrate 202 includes a top surface 202s. In one embodiment, the substrate 202 comprises a crystalline silicon substrate (e.g., Si wafer). In the present embodiment, the substrate 202 is referred to as a (100) substrate having the top surface 202s formed of the (100) crystal plane. In an alternative embodiment, the substrate 202 may include a silicon-on-insulator (SOI) structure.

In some embodiments, the substrate 202 further comprises active regions 204. The active regions 204 may include various doping configurations depending on design requirements. In some embodiments, the active regions 204 may be doped with p-type or n-type dopants. For example, the active regions 204 may be doped with p-type dopants, using a chemical such as boron or $BF_2$ to perform the doping; n-type dopants, using a chemical such as phosphorus or arsenic to perform the doping; and/or combinations thereof. The active regions 204 may act as regions configured for an N-type metal-oxide-semiconductor transistor device (referred to as an NMOS transistor device) and regions configured for a P-type metal-oxide-semiconductor transistor device (referred to as a PMOS transistor device).

An isolation structure (not shown) may be formed in the substrate 202 to isolate the various active regions 204. In some embodiments, the isolation structure has edges intersecting with the top surface 202s of the substrate 202. The isolation structure, for example, is formed using isolation technology, such as local oxidation of silicon (LOCOS) or shallow trench isolation (STI), to define and electrically isolate the various active regions 204. In the present embodiment, the isolation structure includes an STI. The isolation structure may comprise silicon oxide, silicon nitride, silicon oxynitride, fluoride-doped silicate glass (FSG), a low-K dielectric material, other suitable materials, and/or combinations thereof. The isolation structure, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 2, in some embodiments, the gate stack 220 is formed by sequentially depositing and patterning a gate dielectric layer 222, a gate electrode layer 224, and a hard mask layer 226 on the substrate 202. In some embodiments, the gate dielectric layer 222 and the gate electrode layer 224 have a combined height H1. The gate dielectric layer 222, in one example, is a thin film comprising silicon oxide, silicon nitride, silicon oxynitride, high-k dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 222 is a high-k dielectric layer with a thickness in the range of about 10 angstroms to about 30 angstroms. The gate dielectric layer 222 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 222 may further comprise an interfacial layer (not shown) to reduce damage between the gate dielectric layer 222 and substrate 202. The interfacial layer may comprise silicon oxide.

The gate electrode layer 224 is then formed on the gate dielectric layer 222. In some embodiments, the gate electrode layer 224 includes a single layer or multilayer structure. In the present embodiment, the gate electrode layer 224 comprises polysilicon. Further, the gate electrode layer 224 may be doped polysilicon with the same or different doping species. In one embodiment, the gate electrode layer 224 has a thickness in the range of about 30 nm to about 60 nm. The gate electrode layer 224 may be formed using a process such as low-pressure chemical vapor deposition (LPCVD), plasma enhanced chemical vapor deposition (PECVD), other suitable processes, or combinations thereof.

Next, the hard mask layer 226 is formed over the gate electrode layer 224 and a patterned photo-sensitive layer (not shown) is formed on the hard mask layer 226. The pattern of the photo-sensitive layer is transferred to the hard mask layer 226 and then transferred to the gate electrode layer 224 and the gate dielectric layer 222 to form the gate stack 220 over the top surface 202s of the substrate 202. In some embodiments, the hard mask layer 226 includes silicon oxide. In alternative embodiments, the hard mask layer 226 includes silicon nitride, silicon oxynitride, and/or other suitable dielectric materials, and may be formed using a method such as CVD or PVD. The hard mask layer 226 has a thickness in the range from about 100 angstroms to about 1200 angstroms. The photo-sensitive layer is removed thereafter by a dry and/or wet stripping process.

Figure 3:
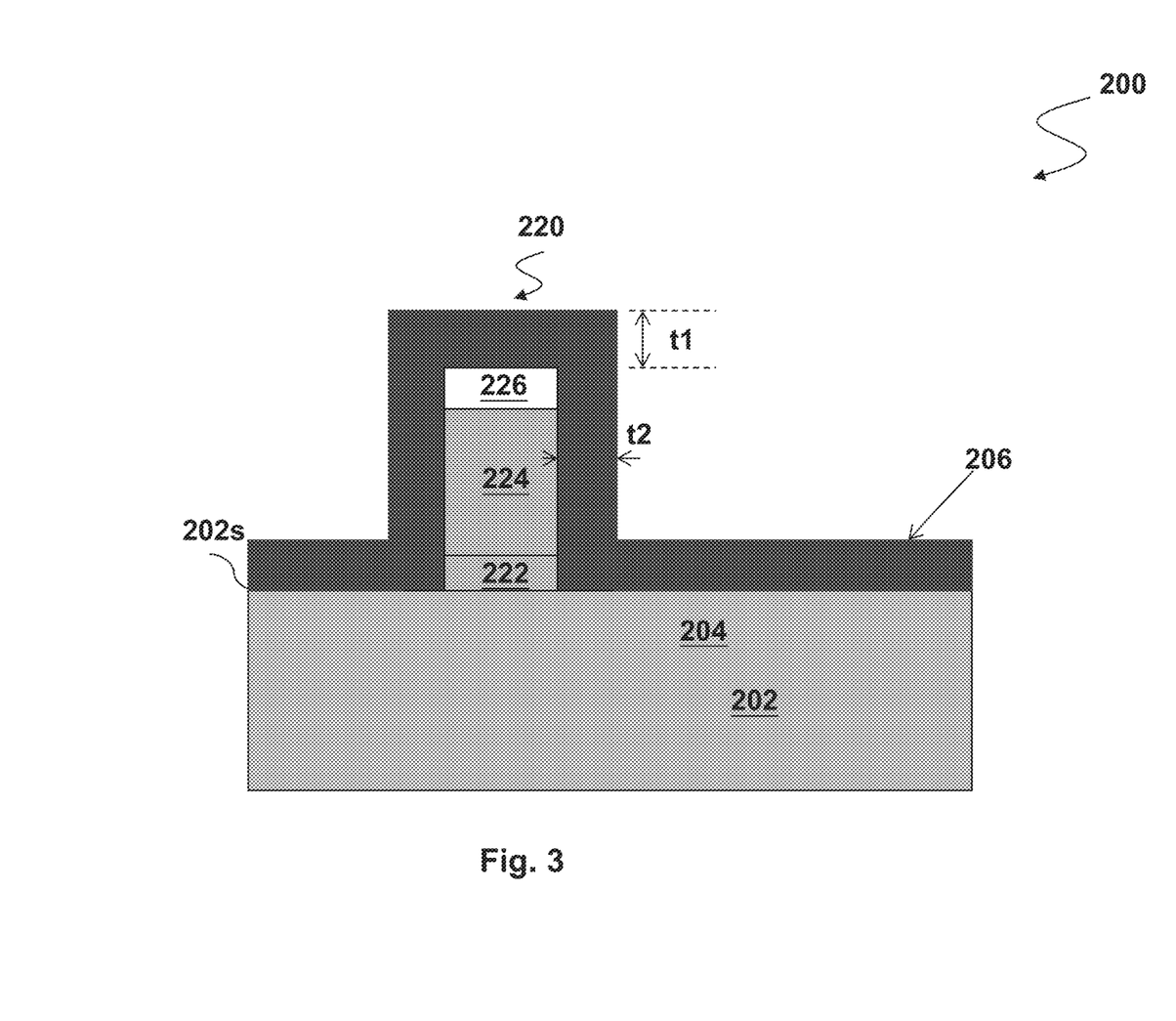

Referring to FIGS. 1 and 3, the method 100 proceeds to step 104 wherein a spacer layer 206 is formed over the substrate 202 and the gate stack 220. The spacer layer 206 has a top portion over a top surface of the gate stack 220, sidewall portions adjoining opposite sidewalls of the gate stack 220, and a bottom portion over the substrate 202. The top portion of the spacer layer 206 has a thickness t1 and the sidewall portion of the spacer layer 206 has a thickness t2. In some embodiments, the spacer layer 206 is a conformal layer with a ratio of t2/t1 ranging from about 70% to about 100%. In some embodiments, the thickness t1 of the spacer layer 206 ranges from about 70 angstroms to about 250 angstroms. In some embodiments, the spacer layer 206 is a single-layer structure. In alternative embodiments, the spacer layer 206 includes a multiple-layer structure. In some embodiments, the spacer layer 206 formed of a material, including silicon nitride, SiCN, or combination thereof. In alternative embodiments, the spacer layer 206 includes silicon oxide, silicon oxynitride, other suitable material, or combinations thereof. In the present embodiment, the spacer layer 206 is formed by a deposition process including LPCVD, PECVD, molecular layer deposition (MLD), ALD, or other suitable techniques.

Figure 4:
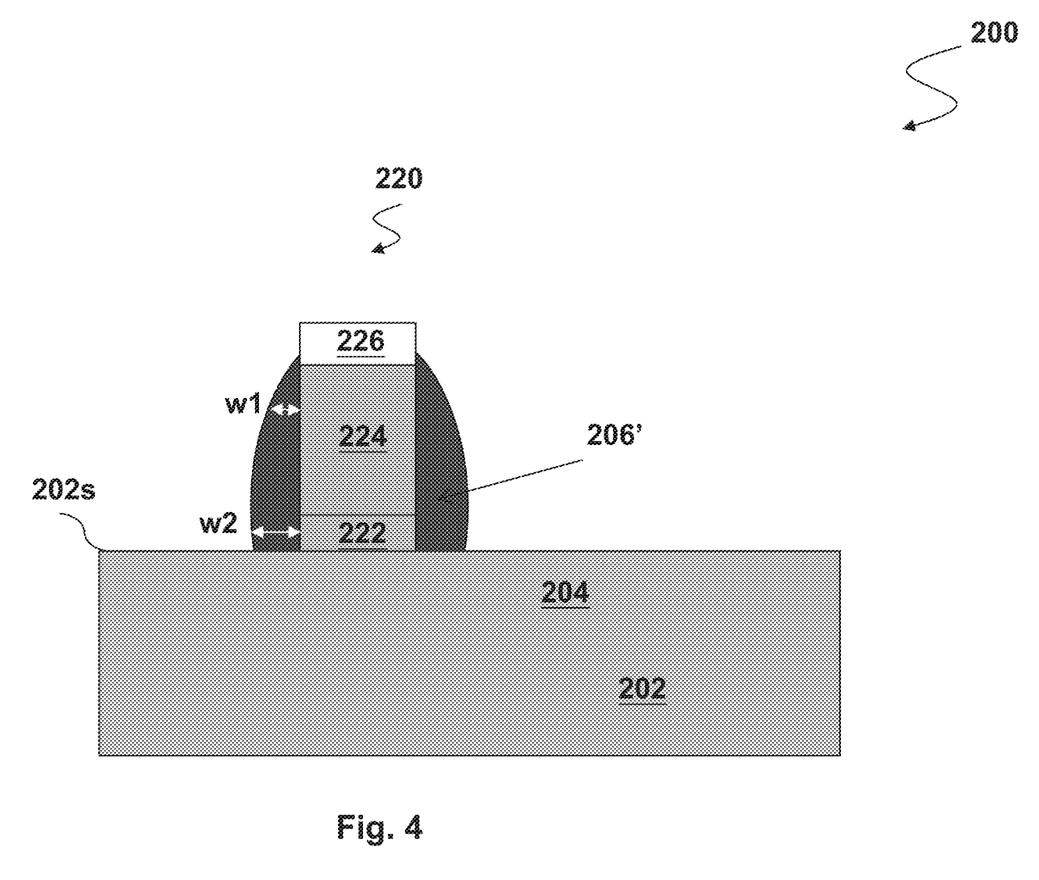

Referring to FIGS. 1 and 4, the method 100 proceeds to step 106 in which at least a portion of the spacer layer 206 is removed to form sidewall spacers (or referred to gate spacers) 206'. In some embodiments, the top portion and the bottom portion of the spacer layer 206 are removed, while leaving the sidewall portion of the spacer layer 206 to form the sidewall spacers 206' adjoining opposite sidewalls of the gate stack 220. The sidewall spacers 206' have an upper portion with a first width w1 and a lower portion with a second width w2 as illustrating in FIG. 4. In some embodiments, the first width w1 is greater than about 3 nm to prevent from an epitaxy feature being formed at top of the gate electrode layer 224 in a subsequent epitaxial growth process. In some embodiments, the first width w1 is less than about the second width w2 for forming a designed dummy layer 210 with details explained below. In some embodiments, the second width w2 is greater than the first width w1. In alternative embodiments, the second width w2 is equal to the first width w1. In some embodiments, the removing step includes an anisotropic etching process. In some embodiments, the removing step includes a dry etching process performed using F-containing and/or Cl-containing gas. In alternative embodiments, the removing step includes a wet etching process performed using wet etchant e.g., $H_3PO_4$.

Figure 5:
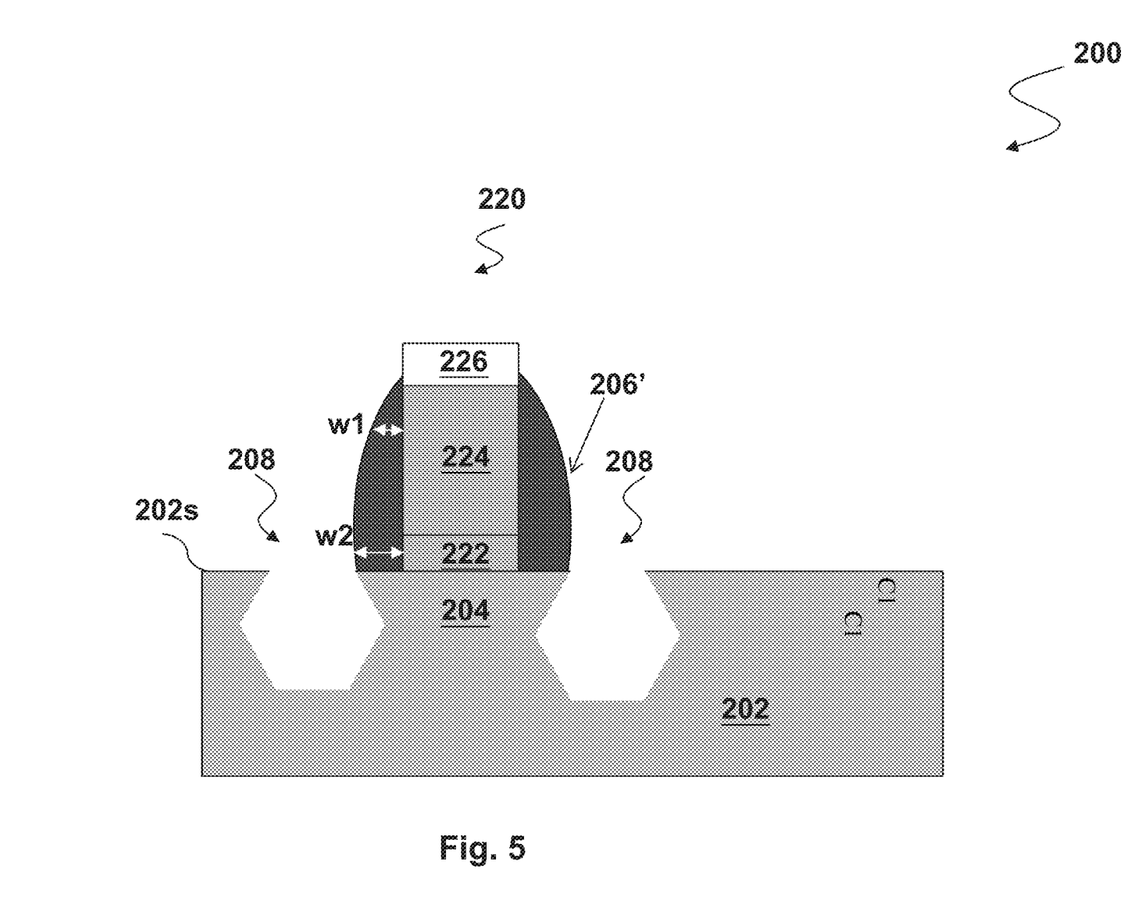

Referring to FIGS. 1 and 5, the method 100 proceeds to step 108 in which recess cavities 208 are formed in the substrate 202. In some embodiments, the recess cavities 208 are adjacent to opposite edges of the gate stack 220 with a portion below the sidewall spacers 206'. In some embodiments, the recess cavities 208 are source and drain (S/D) recess cavities for the gate stack 220. In the present embodiment, the processes for forming the recess cavities 208 are started using an anisotropic dry etching process to break through a native oxide (not shown) formed on the top surface 202s of the substrate 202, followed by an isotropic or anisotropic (dry or wet) etching process. In some embodiments, the anisotropic dry etching process is performed using the sidewall spacers 206' as hard masks to recess the substrate 202. The surface 202s of the substrate 202 uncovered by the sidewall spacers 206' are recessed to form initial recess cavities (not shown) in the substrate 202. In an embodiment, the anisotropic dry etching process may be performed under a pressure of about 1 mTorr to about 1000 mTorr, a power of about 50 W to about 1000 W, a bias voltage of about 20 V to about 500 V, at a temperature of about 20° C. to about 80° C., using HBr and/or $Cl_2$ and/or $CF_4$, $CH_2F_2$, $CHF_3$, $CH_3F$, $NF_3$, $SF_6$) as etch gases. Also, in the embodiments provided, the bias voltage used in the isotropic dry etching process may be tuned to allow better control of an etching direction to achieve desired profiles for the S/D recess regions.

In some embodiments, a wet etching process is then provided to enlarge the initial recess cavities to form the recess cavities 208. In some embodiments, the wet etching process is performed using a chemical including hydration tetramethyl ammonium (TMAH), or the like. In some embodiments, the recess cavities 208 are wedge-shaped with tips extend into the substrate 202. In some embodiments, the recess cavities 208 are wedge-shaped with tips in the region right underneath the sidewall spacers 206' toward the channel region under the gate stack 220.

Figure 6:
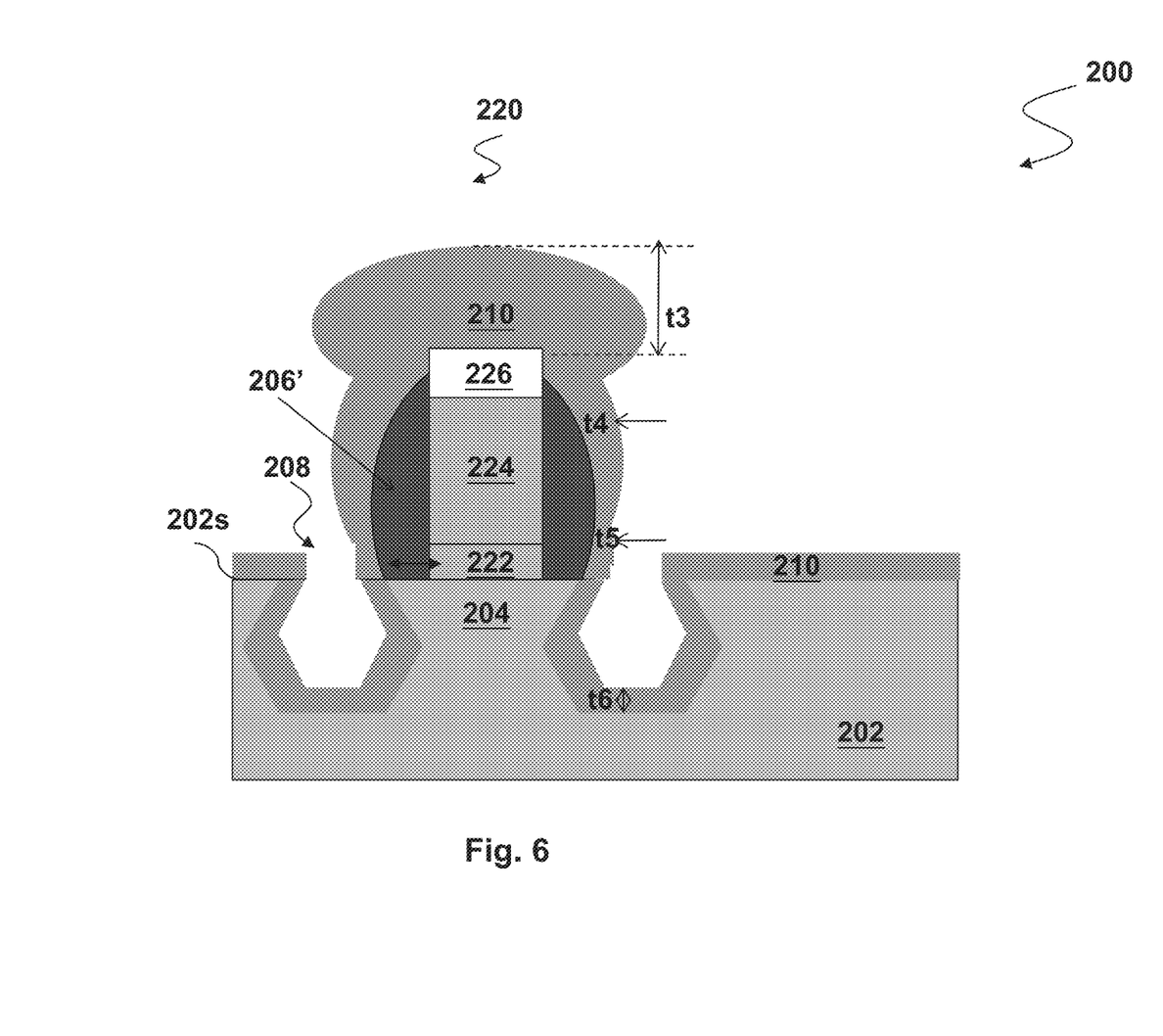

Referring to FIGS. 1 and 6, the method 100 proceeds to step 110 in which the dummy layer 210 is formed adjoining an exterior surface of the sidewall spacers 206'. In the present embodiment, the dummy layer 210 is formed adjoining an exterior surface of the sidewall spacers 206' and in the recess cavities 208. In the present embodiment, the dummy layer 210 is formed in the recess cavities 208 and over the gate stack 220, the sidewall spacers 206', and the substrate 202. In the present embodiment, the dummy layer 210 is partially formed in the recess cavities 208 without completely filling the recess cavities 208. The dummy layer 210 has a top portion over the top surface of the gate stack 220, a sidewall portion adjoining the sidewall spacers 206', a middle portion over the substrate 202, and a bottom portion lining the surface of the recess cavities 208. The sidewall portion of the dummy layer 210 has an upper portion and a lower portion. The top portion of the dummy layer 210 has a thickness t3, the upper sidewall portion of the dummy layer 210 has a thickness (width) t4, the lower sidewall portion of the dummy layer 210 has a thickness (width) t5, and the bottom portion of the dummy layer 210 has a thickness t6. In some embodiments, the dummy layer 210 is a non-conformal layer and the thickness t5 and the thickness t6 are less than the thickness t4. In some embodiments, the dummy layer 210 is a non-conformal layer such that the ratios of t5/t4 and t6/t4 are less than about 50%. In alternative embodiments, the dummy layer 210 is a non-conformal layer with the ratios of t5/t4 and t6/t4 being less than about 30%. In some embodiments, a correlation between the thickness t3, the thickness t4, the thickness t5, and the thickness t6 of the dummy layer 210 satisfies the formulas, t3>t4>t5 and t3>t4>t6.

In some embodiments, the dummy layer 210 is a single-layer structure. In alternative embodiments, the dummy layer 210 includes a multiple-layer structure. In some embodiments, the dummy layer 210 includes a C-containing material, e.g., $C_xH_y$ (x=0~10, y=2~22). In the present embodiment, the dummy layer 210 is formed using a precursor, e.g., $C_3H_8$ and/or $CH_4$, by a deposition process including CVD, PECVD, or plasma doping technique. In the present embodiment, the dummy layer 210 formed at a temperature ranges from about room temperature (e.g., 23° C.) to about 600° C.

Figure 7:
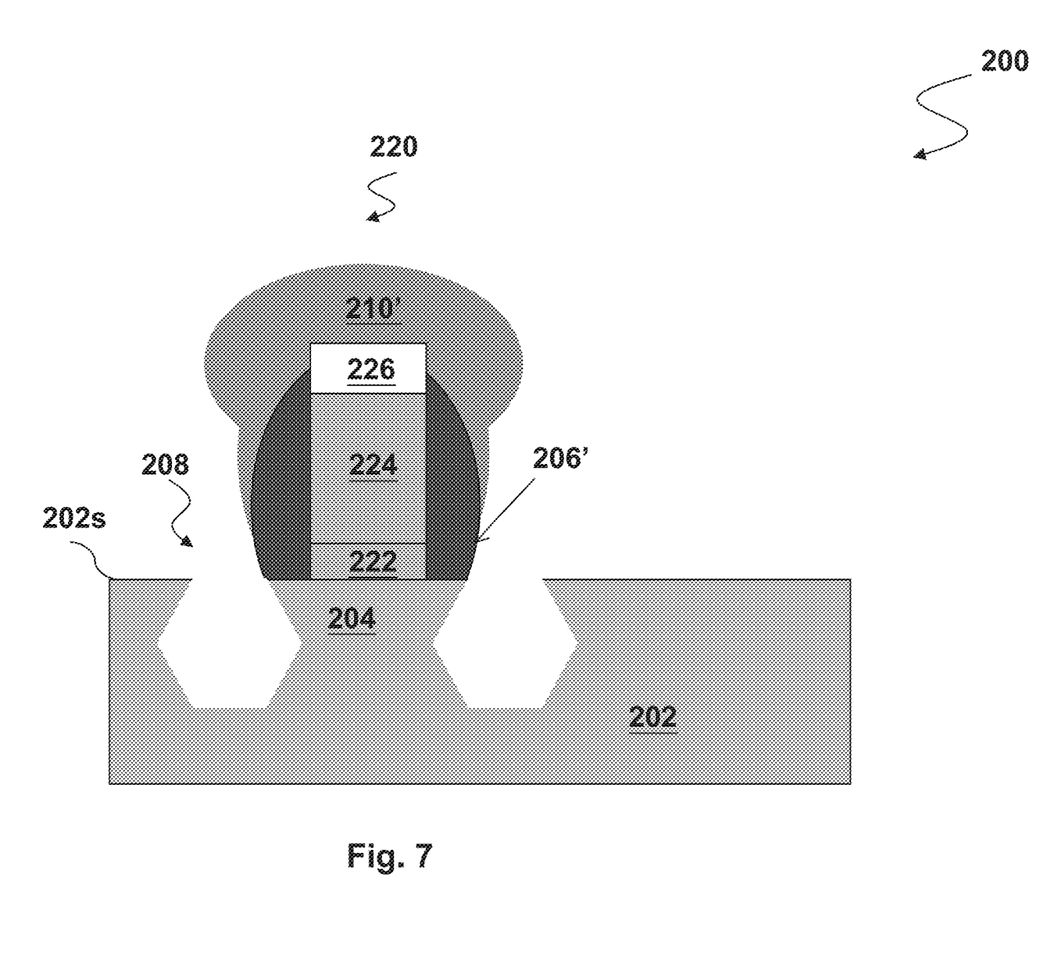

Referring to FIGS. 1 and 7, the method 100 continues with step 112 in which at least a portion of the dummy layer 210 adjoining the sidewall spacers 206' is removed. In the present embodiment, a lower portion of the dummy layer 208 adjoining the sidewall spacers 206' is removed to expose a lower portion of the sidewall spacers 206'. In the present embodiment, an upper portion of the dummy layer 210 adjoining the sidewall spacers 206' is not removed to protect an upper portion of the sidewall spacers 206'. In some embodiments, the removing step removes the dummy layer 210 over the substrate 202 during removing the lower sidewall portion of the dummy layer 210 adjoining the sidewall spacers 206'. In some embodiments, the removing step does not remove the portion of the dummy layer 210 over the gate stack 220 during removing the lower sidewall portion of the dummy layer 210 adjoining the sidewall spacers 206'. In some embodiments, the lower portion of the sidewall spacers 206' is exposed after the step of removing, while the upper portion of the sidewall spacers 206' is covered and protected by the dummy spacer 210'. In the present embodiment, the bottom portion of the dummy layer 210 lining the recess cavities 208 is removed as well during removing the lower sidewall portion of the dummy layer 210 adjoining the sidewall spacers 206'. In some embodiments, the removing step includes an isotropic etching process. In some embodiments, the removing step is a dry etching process, wet etching process, and/or plasma treatment. In some embodiments, the removing step includes a dry etching process using O-containing gas, e.g. $O_2$ gas.

Figure 8:
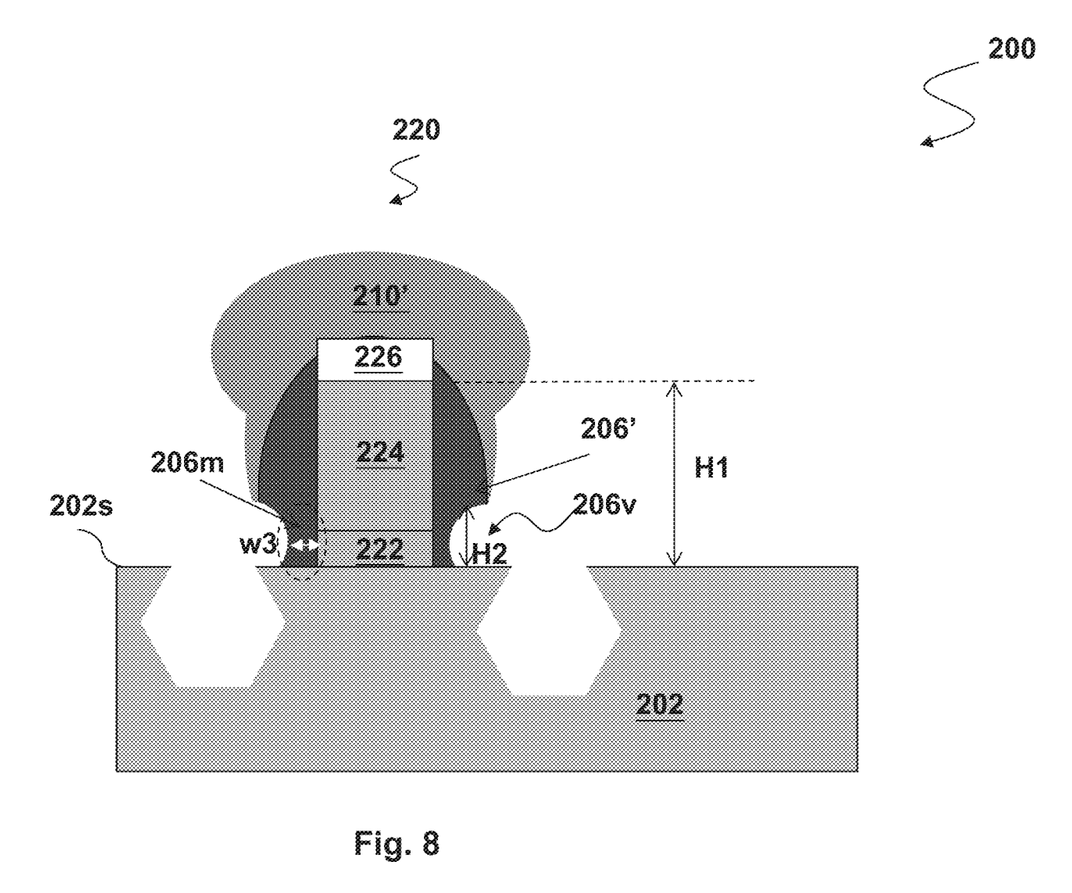

Referring to FIGS. 1 and 8, the method 100 continues with step 114 in which the exposed lower sidewall spacers 206' are removed to form recess cavities 206v. In some embodiments, the upper sidewall spacers 206' are not removed in the removing step because of the protection of the dummy spacer 210'. In some embodiments, recess cavities 206v are vertically located between the upper sidewall spacers 206' and the substrate 202, and leave a room under the upper sidewalls spacers 206' with a height H2 measured from the top surface 202s of the substrate 202 to the bottom surface of the upper sidewall spacers 206'. In some embodiments, the height H2 is greater than about 5 nm. In some embodiments, the height H2 satisfies the following formula, 0.9≥H2/H1≥0.1.

In some embodiments, the lower sidewall spacers 206' are partially removed, while leaving a remaining portion 206m at the corner between the gate stack 220 and the substrate 202 without exposing the lower sidewalls of the gate stack 220. The remaining portion 206m has a width w3. In some embodiments, the width w3 is less than about 4 nm to have an epitaxy feature formed in the recess cavities 206v in a subsequent epitaxial growth process. In alternative embodiments, the exposed lower sidewall spacers 206' are completely removed to expose lower sidewalls of the gate stack 220.

In some embodiments, the removing step for forming the recess cavities 206v includes an isotropic etching process. In some embodiments, the removing step includes a dry etching process, wet etching process, and/or plasma treatment. In some embodiments, the removing step is a dry plasma etching process performed using F-containing (e.g. $CF_4$, $CH_2F_2$, $CHF_3$, $CH_3F$, $NF_3$, $SF_6$) and/or Cl-containing gas (e.g. $Cl_2$). In alternative embodiments, the removing step is a wet etching process using e.g., $H_3PO_4$ chemical.

Figure 9:
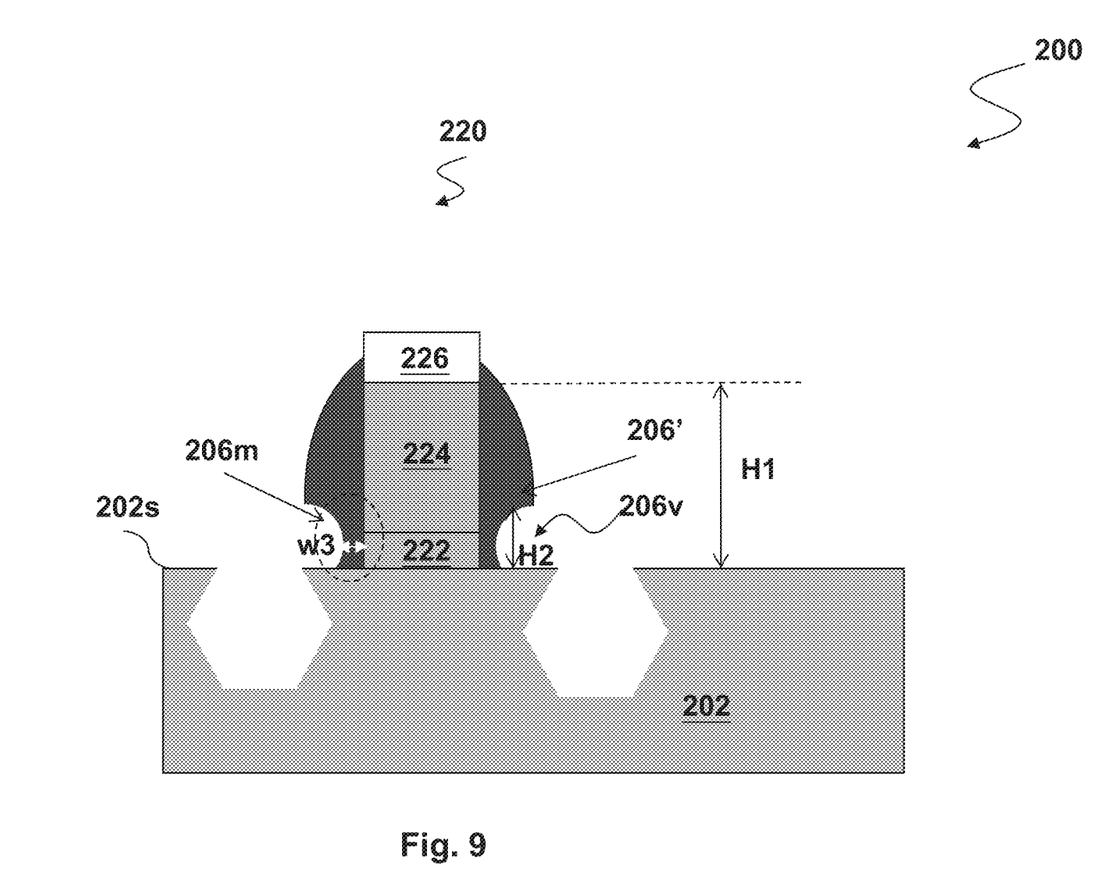

Referring to FIGS. 1 and 9, the method 100 continues with step 116 in which the dummy spacer 210' (the remaining portion of the dummy layer 210 over the gate stack 220 and adjoining the upper sidewall spacers 206') is removed. In some embodiments, the removing step includes a dry etching process using O-containing gas, e.g. $O_2$ gas.

Figure 10:
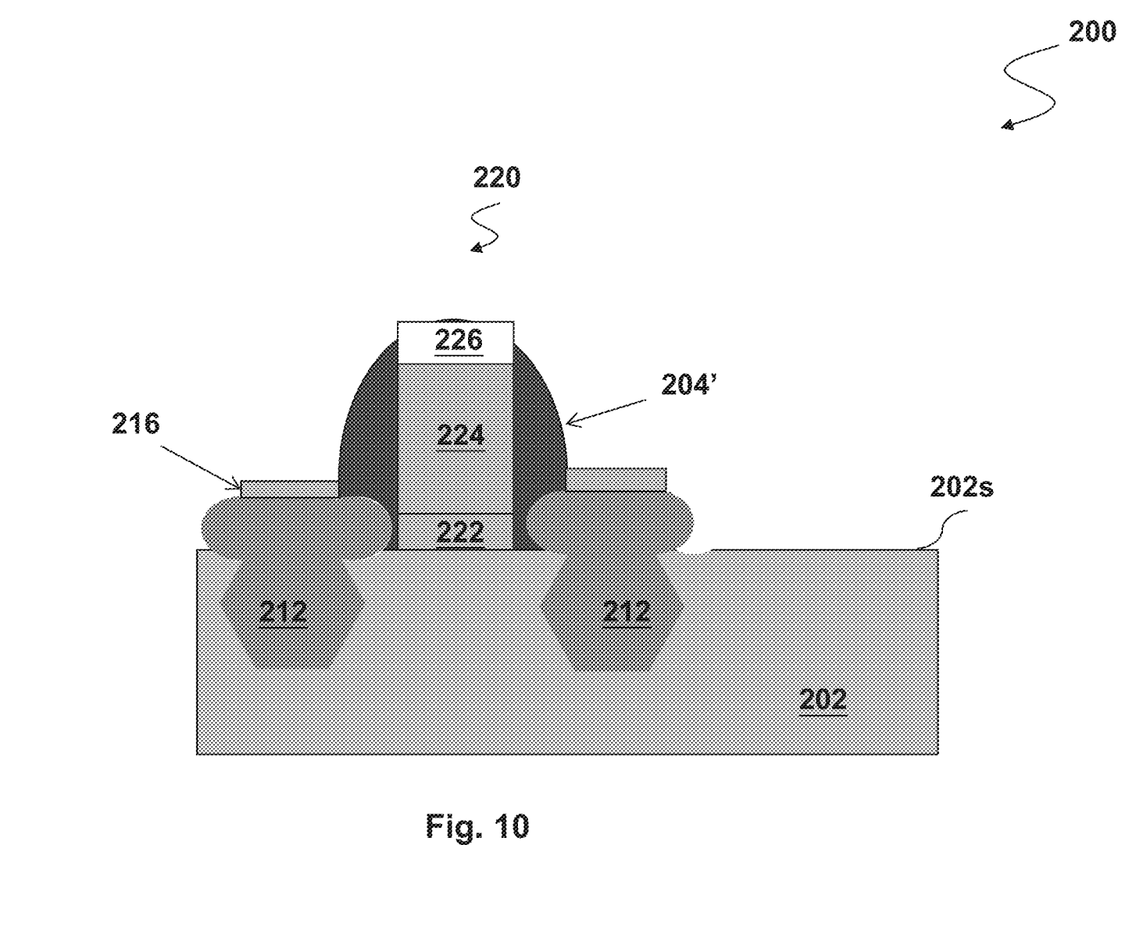

Referring to FIGS. 1 and 10, the method 100 continues with step 118 in which source/drain features 212 are formed in the recess cavities 208 of the substrate 202. In some embodiments, the source/drain features 212 include a strained material and are referred to strained features. In some embodiments, the source/drain features 212 include a portion below the sidewall spacers 206' and adjacent to a sidewall of the gate stack 220. In some embodiments, the source/drain features 212 are formed in a continuous manner with a first portion positioned vertically between the substrate 202 and the sidewall spacers 206' and a second portion in the substrate 202. In some embodiments, the source/drain features 212 are formed to fill the recess cavities 208 and the recess cavities 206v.

In some embodiments, the source/drain features 212 are grown in the recess cavities 208 and the recess cavities 206v using a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In some embodiments, the strained material has a lattice constant different from the substrate 202 to induce a strain or stress on the channel region of the semiconductor device 200, and therefore enable carrier mobility of the device to enhance the device performance. In the present embodiment, the volume of the strained material is increased by providing additional space, the recess cavities 206v, for forming the strained material. Therefore, the strain effect is further increased to enhance the carrier mobility and device performance.

In some embodiments, a pre-cleaning process is performed to clean the recess cavities 208 and/or 206v using a chemical comprising hydrofluoric acid (HF) or other suitable solution. Then, gaseous and/or liquid precursors may be provided to interact with the composition of the substrate 202 to form the strained material, such as silicon germanium (SiGe), to fill the recess cavities 208 and 206v. In one embodiment, the process for forming the strained material comprising SiGe is performed at a temperature of about 500° to 750° C. and under a pressure of about 10 Torr to about 80 Torr, using reaction gases comprising $SiH_2Cl_2$, HCl, $GeH_4$, $B_2H_6$, $H_2$, or combinations thereof. In some embodiments, a ratio of a mass flow rate of the $SiH_2Cl_2$ to a mass flow rate of the HCl is in the range of about 0.45 to 0.55.

Still referring to FIG. 10, a capping layer 216 is formed over the source/drain features 212. The capping layer 216 may function as a protection layer to prevent the underlying strained material from being over-etched in a subsequent etching process. In the present embodiment, the capping layer 216 is formed by an epi growth process. In some embodiments, the capping layer 216 comprises a material different from the strained material. In some embodiments, the capping layer 216 is a silicon-containing layer formed by a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In some embodiments, the capping layer 216 is in-situ formed by using the same process for forming the source/drain features 212. In alternative embodiments, the capping layer 216 is ex-situ formed by using an additional process after forming the source/drain features 212.

It is understood that the semiconductor device 200 may undergo further CMOS processes to form various features such as contacts/vias, interconnect metal layers, dielectric layers, passivation layers, etc. In some embodiment, the gate stacks may be dummy gate stacks. Thus, the CMOS processes further comprise a "gate last" process to replace the polysilicon gate electrode with a metal gate electrode to improve device performance. In one embodiment, the metal gate electrode may include a metal such as Al, Cu, W, Ti, Ta, TiN, TiAl, TiAlN, TaN, NiSi, CoSi, other suitable conductive materials, or combinations thereof. It has been observed that the modified strained structure provides a given amount of strain into channel region of a semiconductor device, thereby enhancing the device performance.

The various embodiments of the present disclosure discussed above offer advantages over conventional methods, it being understood that no particular advantage is required for all embodiments, and that different embodiments may offer different advantages. One of the advantages is the volume of the strained material may be increased by providing an addition space between the sidewall spacer and the substrate for forming the strained material, therefore, the carrier mobility may be enhanced to upgrade the device performance.

In one embodiment, a method comprises forming a gate stack over a substrate, forming a spacer adjoining a sidewall of the gate stack, forming a first recess in the substrate adjacent to an edge of the gate stack, thereafter, forming a sacrificial layer adjoining the spacer, removing a portion of the sacrificial layer to expose a lower portion of the spacer, removing at least a portion of the exposed spacer to form a second recess in the exposed lower portion of the spacer, and forming a strain feature in the second recess.

In another embodiment, a method for fabricating a semiconductor device comprises forming a gate stack over a substrate, forming respective spacers adjoining respective opposite sidewalls of the gate stack, forming respective first recesses in the substrate adjacent to respective opposite edges of the gate stack, thereafter, forming a carbon-containing layer adjoining the spacers, in the first recesses, and over the gate stack and the substrate, removing first portions of the carbon-containing layer to expose respective lower portions of the spacers, while leaving second portions of the carbon-containing layer to protect respective upper portions of the spacers, removing at least a portion of the respective exposed spacers to form respective second recesses below respective non-removed portions of the spacers, removing the remaining portion of the carbon-containing layer, and forming a strain feature in the first recesses and the second recesses.

In still another embodiment, a method for fabricating a semiconductor device, includes forming a gate stack over a surface of a substrate, forming a first recess cavity in the surface of the substrate and adjacent the gate stack, forming a spacer layer over the gate stack and the substrate, removing a portion of the spacer layer to form spacers adjoining opposite sidewalls of the gate stack, wherein the respective spacers have an upper portion with a first width and a lower portion with a second width, the first width being less than the second width, forming a non-conformal layer adjoining an exterior surface of the spacers, wherein the non-conformal layer has an upper portion with a third width and a lower portion with a fourth width, the third width being greater than the fourth width, removing the lower portion of the non-conformal layer to expose respective lower portions of the spacers, while leaving an upper portion of the non-conformal layer to protect the respective upper portions of the spacers, removing at least a portion of respective lower portions of the spacers, while leaving the upper portion of the spacers to form a second recess cavity vertically between the substrate and the upper portion spacers, removing the remaining upper portion of the non-conformal layer, and forming an epitaxial material in the first recess cavity and the second recess cavity.

While the disclosure has described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method, comprising:
    forming a gate stack over a substrate;
    forming a spacer adjoining a sidewall of the gate stack;
    forming a first recess in the substrate aligned to the spacer;
    selectively etching a lower portion of the spacer relative to an upper portion of the spacer to form a second recess in the lower portion of the spacer; and
    forming a strain feature in the second recess, wherein the step of selectively etching the lower portion of the spacer relative to the upper portion of the spacer comprises:
    depositing a dummy layer over the gate stack and the spacer, and lining the first recess;

partially etching the dummy layer such that the dummy layer is removed from the lower portion of the spacer but partially remains over the upper portion of the spacer and partially remains over the gate stack; and exposing the lower portion of the spacer to an etch process.

2. The method of claim 1, wherein the step of forming a first recess comprises etching the substrate using the spacer as a mask.

3. The method of claim 1, wherein the step of forming a strain feature in the second recess further includes forming the strain feature in the first recess.

4. The method of claim 3, wherein the step of forming a strain feature comprises selective epitaxial growth of strained material in the first recess and the second recess in a continuous growth process.

5. The method of claim 3, wherein the step of forming a strain feature comprises forming the strain feature to extend over a channel region portion of the substrate underlying the gate stack.

6. The method of claim 1, wherein the step of selectively etching a lower portion of the spacer comprises covering the upper portion of the spacer with a dummy layer and then exposing the lower portion of the spacer to an isotropic etch process.

7. The method of claim 6, wherein the isotropic etch process comprises a dry etching process performed using an etchant gas selected from the group consisting $CF_4$, $CH_2F_2$, $CHF_3$, $CH_3F$, $NF_3$, $SF_6$, and $Cl_2$.

8. The method of claim 1, wherein the step of partially etching the dummy layer further removes the dummy layer from the first recess.

9. The method of claim 1, wherein the step of forming a first recess further comprises:
exposing the substrate to an oxide etch to remove a native oxide;
exposing the substrate to a dry etch to form an initial recess; and
exposing the substrate to a wet etch to enlarge the initial recess and form the first recess.

10. The method of claim 1, wherein the dummy layer comprises $C_xH_y$, wherein x is in a range of from about 1 to about 10 and y is in a range of from about 2 to about 22.

11. A method, comprising:
forming isolation regions in a semiconductor substrate, the isolation regions defining active regions;
doping the active regions;
depositing one or more gate stack layers over the active regions;
patterning the one or more gate stack layers to form gate stacks extending over respective active regions, the gate stacks defining respective channel regions thereunder;
conformally depositing a spacer layer over respective gate stacks;
anisotropically etching the spacer layer to form first spacers along respective first sidewalls and second spacers along respective second sidewalls of the respective gate stacks;
recessing a first portion of respective active regions and a second portion of respective active regions to form a source recess aligned to the first spacer and a drain recess aligned to the second spacer;
after forming the source recess and the drain recess in the respective active regions, forming second recesses in the respective first spacers, wherein the second recesses extend over the respective channel regions; and
forming a strain feature in the respective source recesses and the respective second recesses.

12. The method of claim 11, wherein the step of recessing a first portion of respective active regions and a second portion of respective active regions to form a source recess aligned to the first spacer and a drain recess aligned to the second spacer comprises:
removing a native oxide from the active regions;
dry etching the active regions to form respective initial source recesses and initial drain recesses, using the respective first spacers and second spacers as respective masks; and
wet etching the initial source recesses and the initial drain recesses to form the respective source recess and drain recesses.

13. The method of claim 11, wherein the step of forming second recesses in the respective first spacers comprises:
non-conformally depositing a dummy layer over the respective first spacers, the dummy layer further lining the respective source recesses;
etching the dummy layer to remove the dummy layer from the respective source recesses and from lower portions of the respective first spacers while leaving upper portions of the respective first spacers covered by the dummy layer; and
isotropically etching the lower portions of the respective first spacers.

14. The method of claim 13, wherein the step of non-conformally depositing a dummy layer comprises depositing the dummy layer to have a first thickness over respective gate stacks, a second thickness less than the first thickness over the upper portions of the respective first spacers, and a third thickness less than the second thickness on the lower portions of respective first spacers.

15. The method of claim 13, wherein isotropically etching the lower portions of the respective first spacers comprises a dry etching process performed using an etchant gas selected from the group consisting $CF_4$, $CH_2F_2$, $CHF_3$, $CH_3F$, $NF_3$, $SF_6$, and $Cl_2$.

16. The method of claim 11, wherein forming the strain feature in the respective source recesses and the respective second recesses comprises a continuous growth selective epitaxial growth process.

17. A method, comprising:
forming a gate spacer over a sidewall of a gate stack disposed over a substrate;
exposing the substrate to a first etch process using the gate spacer as an etch mask, the first etch process forming an initial recess in the substrate;
exposing the substrate to a second etch process using the gate spacer as the etch mask, the second etch process enlarging the initial recess and forming a first recess in the substrate;
forming a dummy layer over an upper portion of the gate spacer, wherein a lower portion of the gate spacer and the first recess are free from the dummy layer;
exposing the lower portion of the gate spacer to a third etch process using the dummy layer as the etch mask; the third etch process forming a second recess in the lower portion of the gate spacer; and
forming a strain feature in the first recess and the second recess.

18. The method of claim 17, wherein the first etch process comprises a dry etch process, and wherein the second etch process comprises a wet etch process.

19. The method of claim 17, wherein the second recess in the lower portion of the gate spacer extends laterally into material of the gate spacer, the second recess not exposing the sidewall of the gate stack.

20. The method of claim 17, wherein the dummy layer comprises $C_xH_y$ wherein x is in a range of from about 1 to about 10 and y is in a range of from about 2 to about 22.

* * * * *